(12) United States Patent
Dorgan et al.

(10) Patent No.: US 11,239,149 B2
(45) Date of Patent: Feb. 1, 2022

(54) METAL INTERCONNECT FUSE MEMORY ARRAYS

(71) Applicant: Intel Corporation, Santa Clara, CA (US)

(72) Inventors: Vincent Dorgan, Hillsboro, OR (US); Jeffrey Hicks, Banks, OR (US); Uddalak Bhattacharya, Beaverton, OR (US); Zhanping Chen, Hillsboro, OR (US); Walid Hafez, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 676 days.

(21) Appl. No.: 15/942,952

(22) Filed: Apr. 2, 2018

(65) Prior Publication Data

US 2019/0304893 A1    Oct. 3, 2019

(51) Int. Cl.
*G11C 11/00* (2006.01)
*H01L 23/50* (2006.01)
*H01L 21/768* (2006.01)
*H01L 21/77* (2017.01)

(52) U.S. Cl.
CPC ........ *H01L 23/50* (2013.01); *H01L 21/76838* (2013.01); *H01L 21/77* (2013.01)

(58) Field of Classification Search
CPC .... H01L 23/50; H01L 21/76838; H01L 21/77
USPC .............................................. 365/129, 225.7
See application file for complete search history.

(56) References Cited

U.S. PATENT DOCUMENTS

| 6,021,079 | A  | * | 2/2000  | Worley ................ G11C 17/16 |
|           |    |   |         | 257/E27.102 |
| 8,395,923 | B2 | * | 3/2013  | Chen .................... G11C 17/18 |
|           |    |   |         | 365/94 |
| 9,922,722 | B2 | * | 3/2018  | Milani ................. G11C 17/16 |
| 9,929,090 | B2 | * | 3/2018  | Chang ................. G11C 17/143 |
| 10,008,445 | B2 | * | 6/2018  | Lee ................... H01L 29/66545 |
| 10,121,875 | B1 | * | 11/2018 | Ho ........................ H01L 28/24 |
| 10,340,275 | B2 | * | 7/2019  | Karpov ............... H01L 27/108 |
| 10,644,123 | B2 | * | 5/2020  | Dewey ............... H01L 29/41733 |
| 10,818,799 | B2 | * | 10/2020 | Pillarisetty ......... H01L 29/6675 |
| 10,868,246 | B2 | * | 12/2020 | Karpov ................ H01L 45/145 |
| 10,892,261 | B2 | * | 1/2021  | Hafez ............... H01L 29/66545 |
| 2014/0332871 | A1 | * | 11/2014 | Kim .................... H01L 23/5221 |
|           |    |   |         | 257/296 |
| 2015/0187431 | A1 | * | 7/2015  | Chung ................. G11C 17/06 |
|           |    |   |         | 365/96 |

\* cited by examiner

*Primary Examiner* — Viet Q Nguyen
(74) *Attorney, Agent, or Firm* — Schwabe, Williamson & Wyatt, P.C.

(57) ABSTRACT

Embodiments herein may describe techniques for an integrated circuit including a metal interconnect above a substrate and coupled to a first contact and a second contact. The first contact and the second contact may be above the metal interconnect and in contact with the metal interconnect. A first resistance may exist between the first contact and the second contact through the metal interconnect. After a programming voltage is applied to the second contact while the first contact is coupled to a ground terminal to generate a current between the first contact and the second contact, a non-conducting barrier may be formed as an interface between the second contact and the metal interconnect. A second resistance may exist between the first contact, the metal interconnect, the second contact, and the non-conducting barrier. Other embodiments may be described and/or claimed.

25 Claims, 7 Drawing Sheets

METAL INTERCONNECT FUSE MEMORY ARRAYS

FIELD

Embodiments of the present disclosure generally relate to the field of integrated circuits, and more particularly, to fuse elements and memory arrays.

BACKGROUND

An integrated circuit (IC) may include many components, e.g., transistors, resistors, capacitors, diodes, formed on a semiconductor substrate. In addition, ICs may often include one or more types of memory arrays formed by multiple memory cells, such as a CMOS memory array including multiple memory cells, an antifuse memory array including multiple antifuse elements, or a fuse memory array including multiple fuse elements. In electronics and electrical engineering, a fuse element may be an electrical safety device that operates to provide overcurrent protection of an electrical circuit. Normally, a fuse element may include a copper wire, strip, or interconnect, which may melt or break down when too much current flows through it, thereby interrupting the current. A fuse element with a copper wire may melt at a high current, and may create a void space in the fuse element after the copper wire has been melted, which may post security risks. In addition, a fuse memory array including multiple fuse elements with copper wire may occupy a large area.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1B:
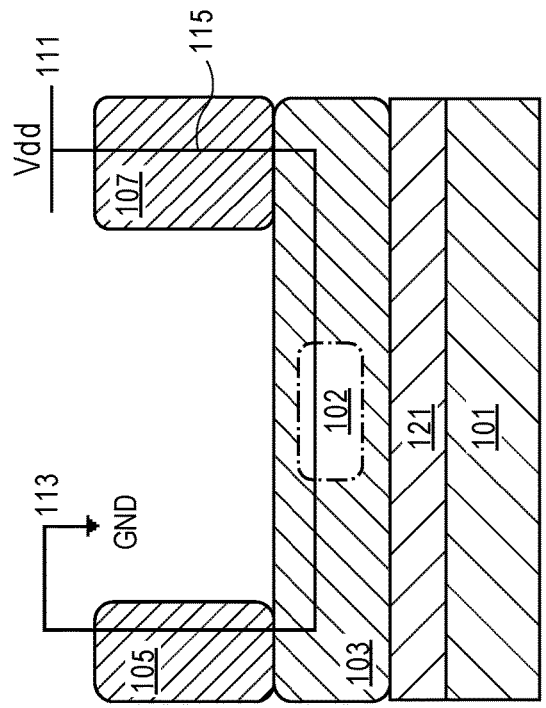
FIGS. 1(a)-1(c) schematically illustrate diagrams of a fuse element including a metal interconnect above a substrate, in accordance with some embodiments.

Conventionally, a fuse element may include a copper interconnect. A copper interconnect of a fuse element may melt at a high current, e.g., around 10 milliamps (mA) to 30 mA, when a high voltage, e.g., 5 voltage, is applied to the fuse element. After the copper interconnect of the fuse element has been melted, the fuse element may include a void space that was occupied by the copper interconnect before it has been melted. Such a void space may be detectable by top-down imaging techniques, hence making the fuse element vulnerable for security reasons. In addition, a fuse memory array including multiple fuse elements having copper interconnects may occupy a large area.

Embodiments herein may include a fuse element including a metal interconnect, e.g., titanium (Ti) or tungsten (W), different from a copper interconnect, coupled to two contacts. Instead of being melted when a programming voltage is applied between the two contacts to generate a current between the two contacts, a non-conducting barrier may be formed as an interface between a contact and the metal interconnect. In some embodiments, the program voltage may be a low voltage supplied by a generic 1.8V input/output voltage, and the current generated by the programming voltage for the fuse element with a metal interconnect may be less than 10 mA, which may be lower than a current used to program a fuse element with a copper interconnect.

After being programmed by a programming voltage, the non-conducting barrier interface between a contact and the metal interconnect may increase the resistance of the fuse element by multiple orders. Hence, a fuse element may be programmed to represent a digital 0 or 1 based on the resistances of the fuse element. In addition, after being programmed, the metal interconnect of the fuse element is not melted, and does not create a void space, hence providing more security. A fuse memory array with fuse elements including a metal interconnect may store security keys on-die without being discovered by inspecting void spaces contained in the fuse memory array. In integrated circuits (ICs), a fuse memory array may be used for chip unit identification, cache repair, and adaptive circuit tuning. Furthermore, the metal interconnect of a fuse element may include a same material as a gate electrode for a transistor. A fuse element with a metal interconnect may occupy a smaller area compared to a fuse element with a copper interconnect.

Embodiments herein may present an IC including a metal interconnect above a substrate and coupled to a first contact and a second contact. The first contact and the second contact may be above the metal interconnect and in contact with the metal interconnect. A first resistance may exist between the first contact and the second contact through the metal interconnect. After a programming voltage is applied to the second contact while the first contact is coupled to a ground terminal to generate a current between the first contact and the second contact, a non-conducting barrier may be formed as an interface between the second contact and the metal interconnect. A second resistance may exist between the first contact, the metal interconnect, the second contact, and the non-conducting barrier.

Embodiments herein may present a method for forming an IC. The method may include: forming a metal interconnect above a substrate; forming a first contact above the metal interconnect and in contact with the metal interconnect; and forming a second contact above the metal interconnect and in contact with the metal interconnect. A first resistance may exist between the first contact and the second contact through the metal interconnect. After a programming voltage is applied to the second contact while the first contact is coupled to a ground terminal to generate a current between the first contact and the second contact, a non-conducting barrier may be formed as an interface between the second contact and the metal interconnect. A second resistance may exist between the first contact, the metal interconnect, the second contact, and the non-conducting barrier.

Embodiments herein may present a computing device including a circuit board and a fuse memory array coupled to the circuit board. The fuse memory array may include a plurality of fuse cells. A fuse cell of the plurality of fuse cells may include a fuse element coupled to a selector. The fuse element may include a metal interconnect above a substrate, a first contact and a second contact above the metal interconnect and in contact with the metal interconnect. The first contact of the fuse element may be coupled to a bit line of the fuse memory array. The second contact of the fuse element may be coupled to a first contact of the selector, and the selector may include a second contact coupled to a word line of the fuse memory array. A first resistance may exist between the first contact and the second contact through the metal interconnect. After a programming voltage is applied to the second contact while the first contact is coupled to a ground terminal to generate a current between the first contact and the second contact, a non-conducting barrier may be formed as an interface between the second contact and the metal interconnect. A second resistance may exist between the first contact, the metal interconnect, the second contact, and the non-conducting barrier.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide (SiO2) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 1C:
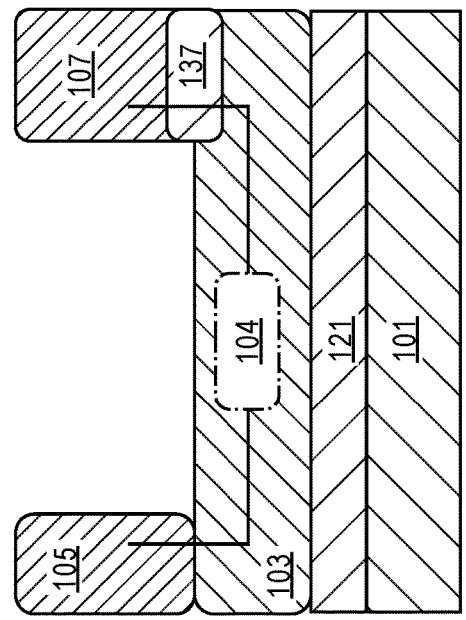
Figure 1A:
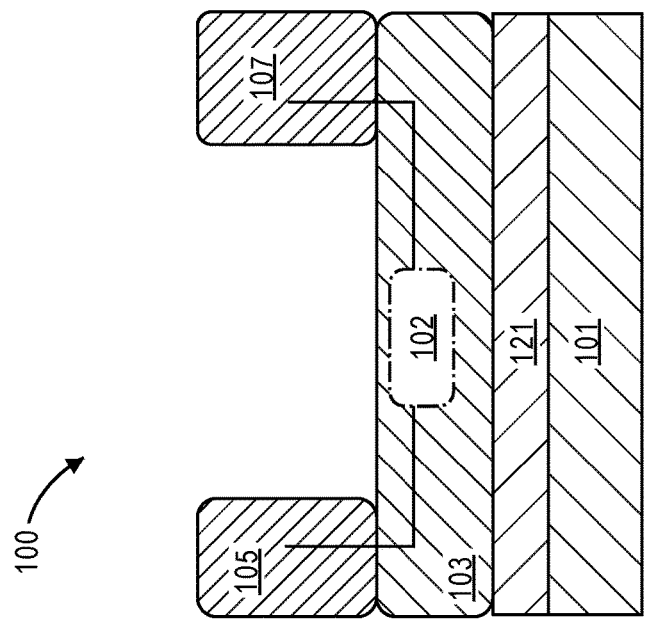

FIGS. 1(a)-1(c) schematically illustrate diagrams of a fuse element 100 including a metal interconnect 103 above a substrate 101, in accordance with some embodiments. For clarity, features of the fuse element 100, the metal interconnect 103, and the substrate 101 may be described below as examples for understanding an example fuse element, a metal interconnect, and a substrate. It is to be understood that there may be more or fewer components within a fuse element, a metal interconnect, and a substrate. Further, it is to be understood that one or more of the components within a fuse element, a metal interconnect, and a substrate may include additional and/or varying features from the description below, and may include any device that one having ordinary skill in the art would consider and/or refer to as a fuse element, a metal interconnect, and a substrate.

In embodiments, as shown in FIG. 1(a), the fuse element 100 may include the substrate 101 and the metal interconnect 103 above the substrate 101. The metal interconnect 103 may include titanium (Ti), tungsten (W), or other metal elements that may not melt as a Cu interconnect when a programing voltage is applied. An optional interlayer dielectric (ILD) layer 121 may be between the substrate 101 and the metal interconnect 103. A contact 105 and a contact 107 may be above the metal interconnect 103 and in contact with the metal interconnect 103. A first resistance 102 may exist between the contact 105 and the contact 107 through the metal interconnect 103. The resistance 102 represented by a symbol may be a symbolic view to show a resistance, not a real physical component within the metal interconnect 103.

As shown in FIG. 1(b), a programming voltage 111 may be applied to the contact 107 while the contact 105 may be coupled to a ground terminal 113 to generate a current 115 between the contact 105 and the contact 107. The current 115 may be less than or equal to about 10 mA, which may be smaller than a current for programming a fuse element with a copper interconnect to melt the copper interconnect. The programming voltage 111 may be supplied by a 1.8V, which may be a generic input/output voltage source to an IC. After taking into account supply tolerance and voltage drop between supply pins and the on-die fuse memory array, the fuse element 100 may be programmable at around 1.6V.

As shown in FIG. 1(c), after the programming voltage 111 may be applied to the contact 107 and the current 115 may be generated between the contact 105 and the contact 107, a non-conducting barrier 137 may be formed as an interface between the contact 107 and the metal interconnect 103. The non-conducting barrier 137 may be formed due to self-heating in the metal interconnect 103 generated by the current 115. The non-conducting barrier 137 may prevent the current 115 flow, or substantially reduce the current 115 by multiple orders of magnitude. Hence, the fuse element 100 may be considered electrically open and a programmed or "blown" fuse when the non-conducting barrier 137 is formed. A second resistance 104 may exist between the contact 105, the metal interconnect 103, the contact 107, and the non-conducting barrier 137. In embodiments, the first resistance 102 may be in a range of about 100 ohms to about 600 ohms, while the second resistance 104 may be larger than 10,000 ohms.

In embodiments, the first resistance 102 of the fuse element 100 may represent a digital 0 or a digital 1, while the second resistance 104 may represent a digital 1 or a digital 0, respectively. The fuse element 100 may be programmed to be 0 or 1, without creating a void space in the place occupied by the metal interconnect 103. Hence, the fuse element 100 include the metal interconnect 103, e.g., Ti, W, or other metal material that can form the non-conducting barrier 137, may be more secure than a fuse element including a copper interconnect. The fuse element 100 may be used to store security keys on-die, and its stored content may not be able to be discovered by imaging inspection of the void spaces contained in the fuse element.

In embodiments, the substrate 101 may be a silicon substrate, a glass substrate, such as soda lime glass or borosilicate glass, a metal substrate, a plastic substrate, a substrate including and SiO2, or another suitable substrate. The ILD layer 121 may include a silicon oxide (SiO) film, a silicon nitride (SiN) film, O3-tetraethylorthosilicate (TEOS), O3-hexamethyldisiloxane (HMDS), plasma-TEOS oxide layer, or other suitable materials.

In embodiments, the contact 105 or the contact 107 may be formed as a single layer or a stacked layer using one or more conductive films including a conductive material. For example, the contact 105 or the contact 107 may include Ti, W, molybdenum (Mo), gold (Au), platinum (Pt), ruthenium (Ru), iridium (Ir), aluminum (Al), Cu, tantalum (Ta), nickel (Ni), chromium (Cr), hafnium (Hf), indium (In), or an alloy of Ti, Mo, Au, Pt, Al Ni, Cu, Cr, TiAlN, HfAlN, or InAlO. For example, the contact 105 or the contact 107 may include tantalum nitride (TaN), titanium nitride (TiN), iridium-tantalum alloy (Ir—Ta), indium-tin oxide (ITO), the like, and/or a combination thereof. The contact 105 or the contact 107 may include a via of an interconnect of the integrated circuit.

Figure 2:
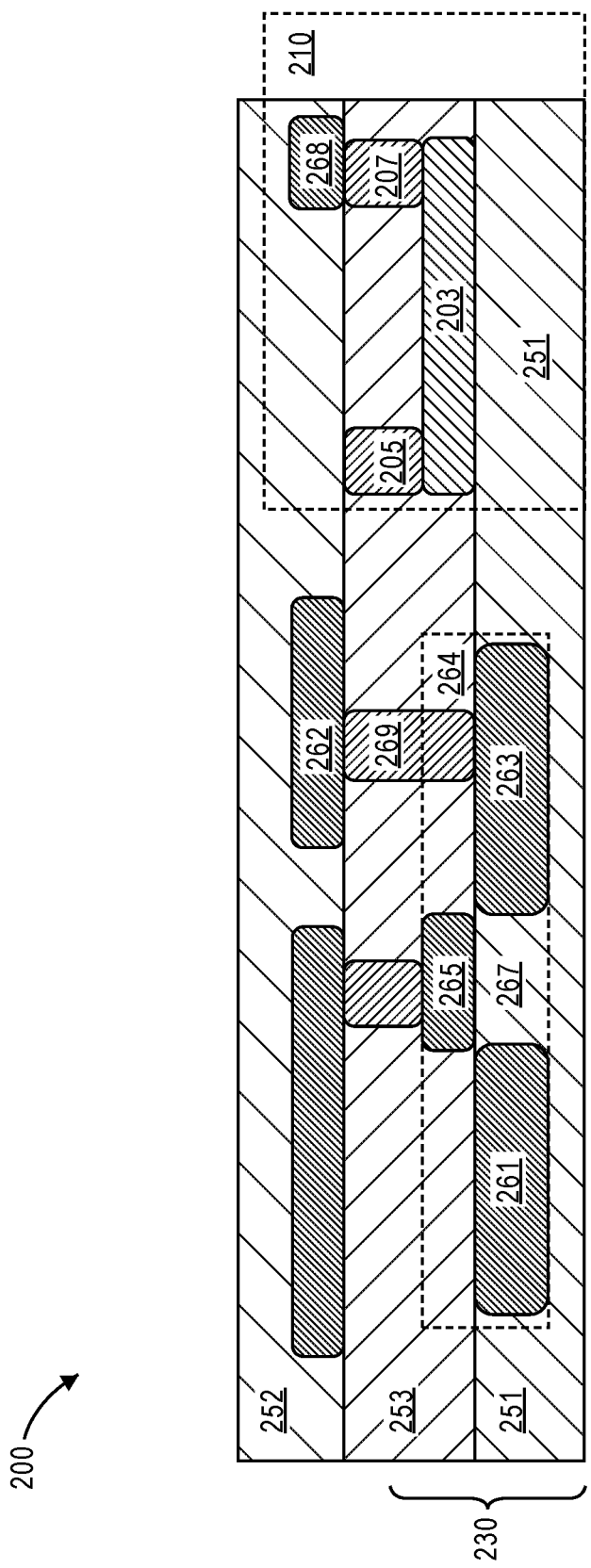
FIG. 2 schematically illustrates a diagram of an integrated circuit (IC) with a fuse element including a metal interconnect above a substrate, in accordance with some embodiments.

FIG. 2 schematically illustrates a diagram of an IC 200 with a fuse element 210 including a metal interconnect 203 above a substrate 251, in accordance with some embodiments. In embodiments, the fuse element 210, the metal interconnect 203, and the substrate 251 may be examples of the fuse element 100, the metal interconnect 103, and the substrate 101, respectively, shown in FIG. 1.

In embodiments, the fuse element 210 may include the metal interconnect 203 above the substrate 251. The fuse element 210 may further include a contact 205 and a contact 207 above the metal interconnect 203 and in contact with the metal interconnect 203. The metal interconnect 203, the contact 205 and the contact 207 may be formed within an ILD layer 253, where the contact 205 and the contact 207 may be a via embedded within the ILD layer 253. The ILD layer 253 may include one or more sublayers of different materials, not shown. The contact 205, or the contact 207 may be further coupled to other interconnect, e.g., an interconnect 268 embedded in an ILD layer 252.

In embodiments, the IC 200 may include a front-end-of-line (FEOL) 230. The FEOL 230 may include the substrate 251. In addition, the FEOL 230 may include other devices, e.g., a transistor 264. In embodiments, the transistor 264 may be a FEOL transistor, including a source 261, a drain 263, and a gate electrode 265, with a channel 267 between the source 261 and the drain 263 under the gate electrode 265. Furthermore, the transistor 264 may be coupled to interconnects, e.g., the interconnect 262, through a via 269. In embodiments, the gate electrode 265 and the metal interconnect 203 may include a same material at a same metal layer, and embedded in the same ILD layer 253. In some other embodiments, the gate electrode 265 and the metal interconnect 203 may be in different metal layers of the IC, as shown in FIG. 3.

Figure 3:
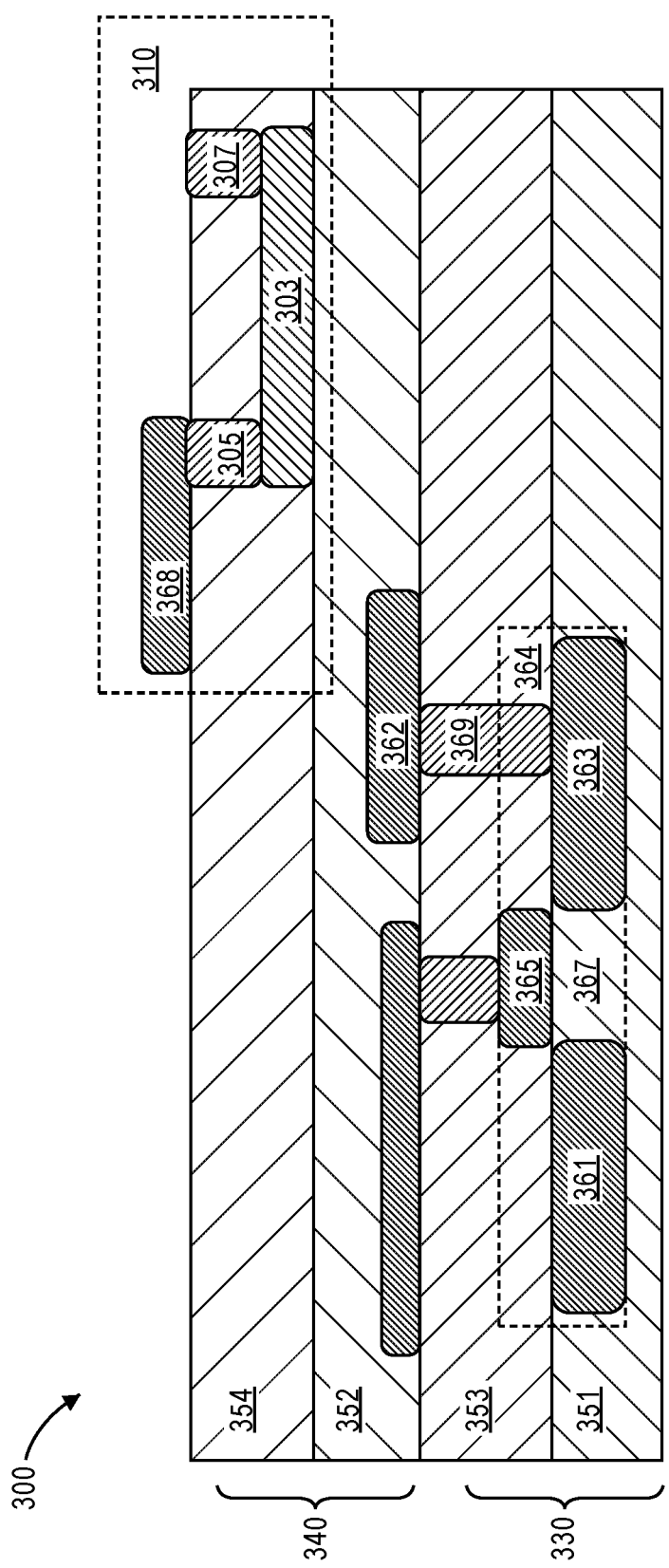
FIG. 3 schematically illustrates a diagram of an IC with a fuse element including a metal interconnect in back-end-of-line (BEOL) on a substrate, in accordance with some embodiments.

FIG. 3 schematically illustrates a diagram of an IC 300 with a fuse element 310 including a metal interconnect 303 in back-end-of-line (BEOL) on a substrate 351, in accordance with some embodiments. In embodiments, the fuse element 310, the metal interconnect 303, and the substrate 351 may be examples of the fuse element 100, the metal interconnect 103, and the substrate 101, respectively, as shown in FIG. 1. Furthermore, the fuse element 310, the metal interconnect 303, and the substrate 351 may be similar to the fuse element 210, the metal interconnect 203, and the substrate 251, respectively, as shown in FIG. 2.

In embodiments, the fuse element 310 may be formed at BEOL 340. The fuse element 310 may include the metal interconnect 303 above the substrate 351, embedded in an ILD layer 354. The ILD layer 354 may include one or more sublayers of different materials. Although not shown, there may be multiple metal layers or ILD layers included in the BEOL 340. The fuse element 310 may further include a contact 305 and a contact 307 above the metal interconnect 303 and in contact with the metal interconnect 303. The contact 305 and the contact 307 may be a via embedded within the ILD layer 354. The contact 305, or the contact 307 may be further coupled to other interconnect, e.g., an interconnect 368.

In embodiments, the IC 300 may be include a FEOL 330. The FEOL 330 may include the substrate 351. In addition, the FEOL 330 may include other devices, e.g., a transistor 364. In embodiments, the transistor 364 may be a FEOL transistor, including a source 361, a drain 363, and a gate electrode 365, with a channel 367 between the source 361 and the drain 363 under the gate electrode 365. Furthermore, the transistor 364 may be coupled to interconnects, e.g., an interconnect 362 within an ILD layer 352 through a via 369. In embodiments, the gate electrode 365 and the metal interconnect 303 may include a same material, but in different metal layers of the IC 300.

Figure 4:
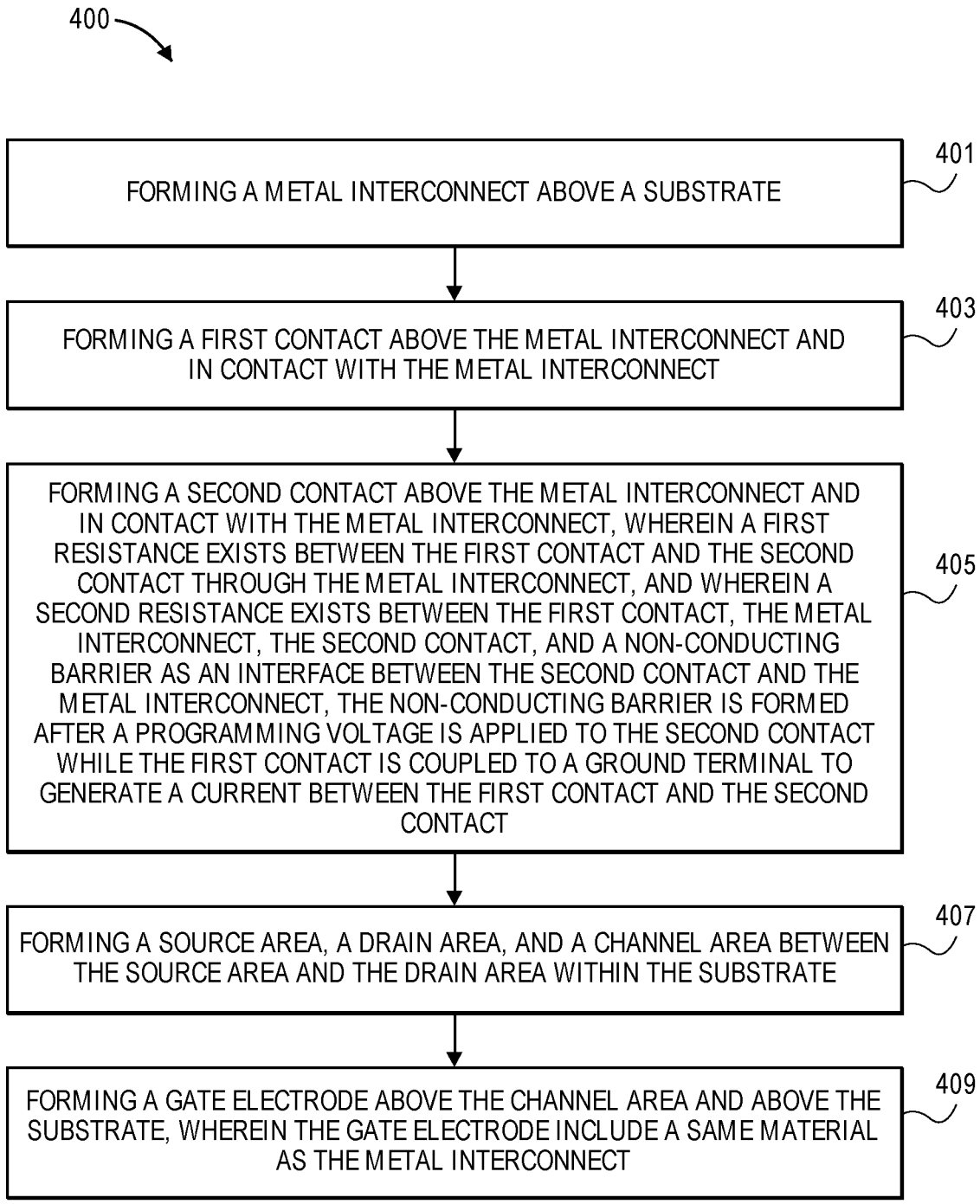
FIG. 4 schematically illustrates a process for forming a fuse element including a metal interconnect above a substrate, in accordance with some embodiments.

FIG. 4 illustrates a process 400 for forming a fuse element including a metal interconnect above a substrate, in accordance with some embodiments. In embodiments, the process 400 may be applied to form the fuse element 100 in FIG. 1, the fuse element 210 in FIG. 2, or the fuse element 310 in FIG. 3.

At block 401, the process 400 may include forming a metal interconnect above a substrate. For example, the process 400 may include forming the metal interconnect 103 above the substrate 101, as shown in FIG. 1.

At block 403, the process 400 may include forming a first contact above the metal interconnect and in contact with the metal interconnect. For example, the process 400 may include forming the contact 105 above the metal interconnect 103 and in contact with the metal interconnect 103, as shown in FIG. 1.

At block 405, the process 400 may include forming a second contact above the metal interconnect and in contact with the metal interconnect. A first resistance may exist between the first contact and the second contact through the metal interconnect. After a programming voltage is applied to the second contact while the first contact is coupled to a ground terminal to generate a current between the first contact and the second contact, a non-conducting barrier may be formed as an interface between the second contact and the metal interconnect. A second resistance may exist between the first contact, the metal interconnect, the second contact, and the non-conducting barrier. For example, the process 400 may include forming the contact 107 above the metal interconnect 103 and in contact with the metal interconnect 103, as shown in FIG. 1. The non-conducting barrier 137 may be formed as an interface between the contact 107 and the metal interconnect 103. The first resistance 102 may exist between the contact 105 and the contact 107 through the metal interconnect 103. The second resistance 104 may exist between the contact 105, the metal interconnect 103, the contact 107, and the non-conducting barrier 137.

At block 407, the process 400 may include forming a source area within the substrate, a drain area within the substrate, and a channel area between the source area and the drain area within the substrate. For example, the process 400 may include forming the source area 261, the drain area 263 within the substrate 251, and the channel area 267 between the source area 261 and the drain area 263 within the substrate 251, as shown in FIG. 2.

At block 409, the process 400 may include forming a gate electrode above the channel area and above the substrate, wherein the gate electrode include a same material as the metal interconnect. For example, the process 400 may include forming the gate electrode 265 above the channel area 267 and above the substrate 251. The gate electrode 265 may include a same material as the metal interconnect 203.

In addition, the process 400 may include additional operations to form other layers, e.g., ILD layers, or encapsulation layers, insulation layers, not shown. In some embodiments, the various blocks, e.g., the block 401, the block 403, the block 405, the block 407, and the block 409, may not be ordered as shown in FIG. 4. Various blocks of the process 400 may be performed in an order different from the one shown in FIG. 4. For example, the block 407 and the block 409 may be performed before the block 401, while the block 403 and the block 405 may be performed in parallel. Other orders of actions may be performed for the blocks shown in FIG. 4.

Figure 5:
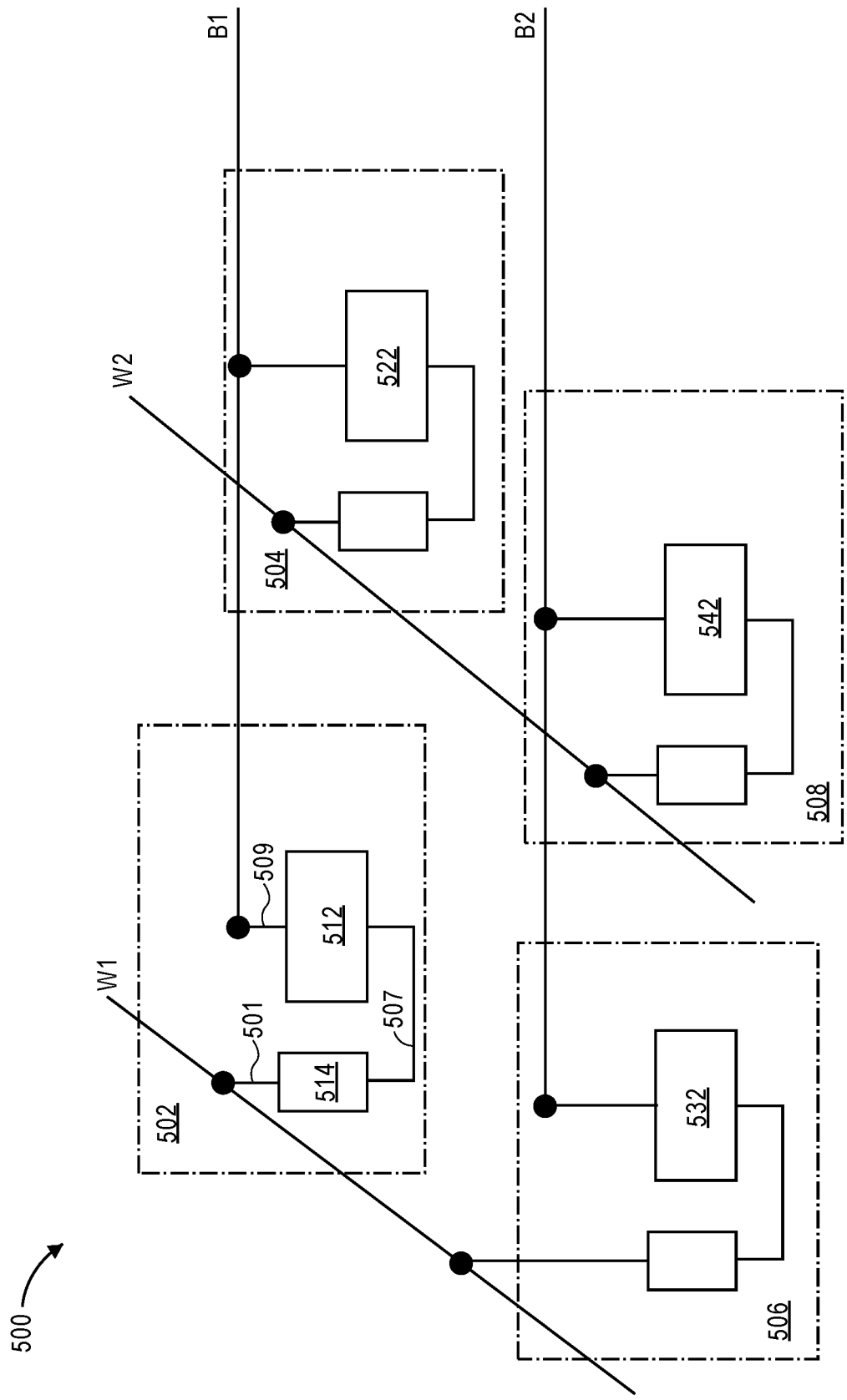
FIG. 5 schematically illustrates a fuse memory array with multiple fuse cells, where a fuse cell includes a fuse element with a metal interconnect above a substrate, in accordance with some embodiments.

FIG. 5 schematically illustrates a fuse memory array 500 with multiple fuse cells, e.g., a fuse cell 502, a fuse cell 504, a fuse cell 506, and a fuse cell 508, where a fuse cell includes a fuse element with a metal interconnect above a substrate, in accordance with some embodiments. For example, the fuse cell 502 includes a fuse element 512, the fuse cell 504 includes a fuse element 522, the fuse cell 506 includes a fuse element 532, and the fuse cell 508 includes a fuse element 542. In embodiments, the fuse element 512, the fuse element 522, the fuse element 532, and the fuse element 542 may be similar to the fuse element 100, the fuse element 210, the fuse element 310, or a fuse element formed following the process 400. In embodiments, the multiple fuse cells may be arranged in a number of rows and columns coupled by bit lines, e.g., bit line B1 and bit line B2, and word lines, e.g., word line W1 and word line W2.

A fuse cell, e.g., the fuse cell 502, may be coupled in series with other fuse cells, e.g., the fuse cell 504, of the same row, and may be coupled in parallel with the fuse cells of other rows, e.g., the fuse cell 506 and the fuse cell 508. The fuse memory array 500 may include any suitable number of one or more fuse cells. Although the fuse memory array 500 is shown in FIG. 5 with two rows that each includes two fuse cells coupled in series, other embodiments may include other numbers of rows and/or numbers of fuse cells within a row. In some embodiments, the number of rows may be different from the number of columns in a fuse memory array. Each row of the fuse memory array may have a same number of fuse cells. Additionally, or alternatively, different rows may have different numbers of fuse cells.

In embodiments, multiple fuse cells, such as the fuse cell 502, the fuse cell 504, the fuse cell 506, and the fuse cell 508, may have a similar configuration. For example, the fuse cell 502 may include a selector 514 and the fuse element 512. The fuse cell 502 may be controlled through the selector 514 coupled to a bit line and a word line to read from the fuse cell, write to the fuse cell, and/or perform other memory operations. For example, the selector 514 may have an electrode 501 coupled to the word line W1, and the fuse element 512 may have a contact 509 coupled to the bit line B1. In addition, the selector 514 and the fuse element 512 may be coupled together by the electrode 507.

In embodiments, the fuse element 512 may be individually controllable by the selector 514 to switch between a first state and a second state. When the word line W1 is active, the selector 514 may select the fuse element 512. A signal from the word line W1 may pass through the selector 514, further through the fuse element 512, and reaching the other electrode, which is the bit line B1.

In various embodiments, the fuse elements, e.g., the fuse element 512, the fuse element 522, the fuse element 532, and the fuse element 542, included in the fuse memory array 500 may be formed in BEOL processing. Accordingly, the fuse memory array 500 may be formed in higher metal layers, e.g., metal layer three and/or metal layer four, of the integrated circuit above the active substrate region, and may not occupy the active substrate area that is occupied by conventional transistors or memory devices.

Figure 6:
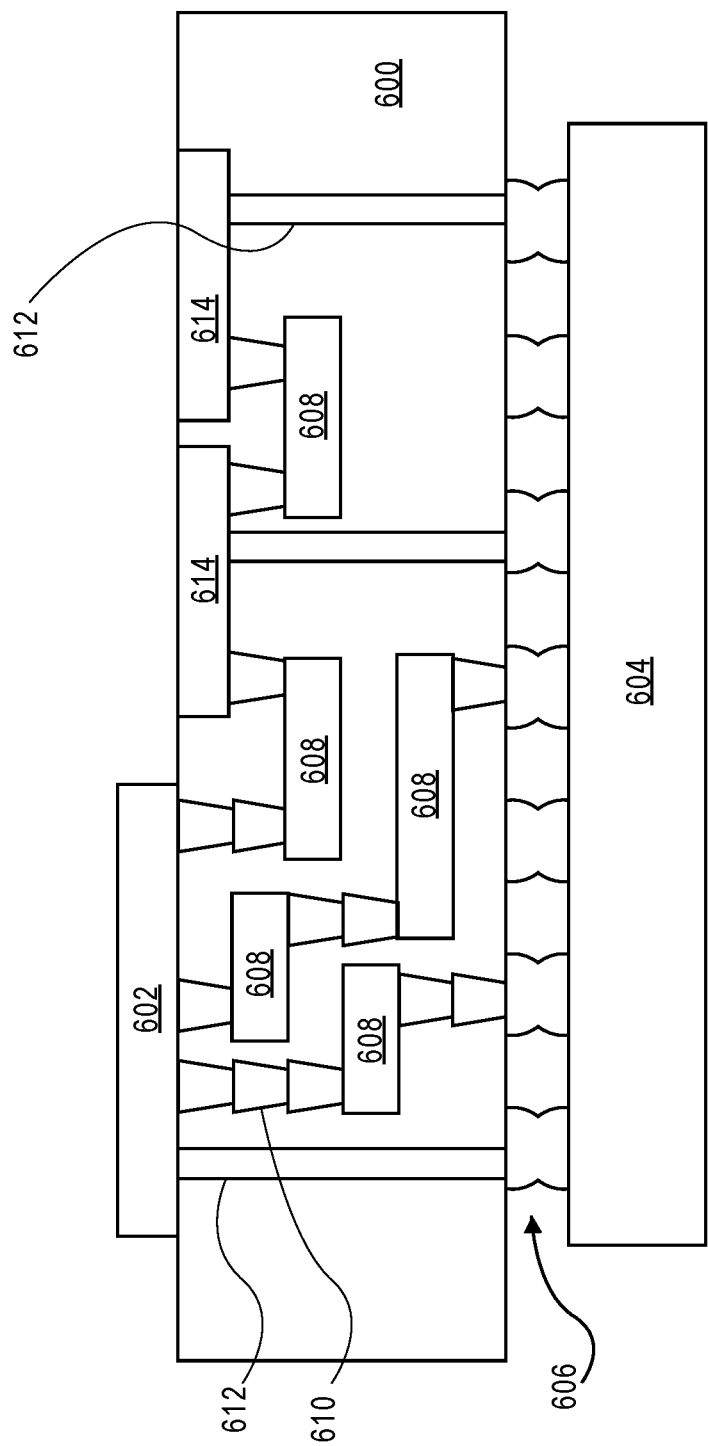
FIG. 6 schematically illustrates an interposer implementing one or more embodiments of the disclosure, in accordance with some embodiments.

FIG. 6 illustrates an interposer 600 that includes one or more embodiments of the disclosure. The interposer 600 may be an intervening substrate used to bridge a first substrate 602 to a second substrate 604. The first substrate 602 may be, for instance, a substrate support for a fuse element, e.g., the fuse element 100 shown in FIG. 1, the fuse element 210 shown in FIG. 2, or the fuse element 310 shown in FIG. 3. The second substrate 604 may be, for instance, a memory module, a computer motherboard, or another integrated circuit die. For example, the second substrate 604 may be a memory module including the fuse memory array 500 as shown in FIG. 5. Generally, the purpose of an interposer 600 is to spread a connection to a wider pitch or to reroute a connection to a different connection. For example, an interposer 600 may couple an integrated circuit die to a ball grid array (BGA) 606 that can subsequently be coupled to the second substrate 604. In some embodiments, the first and second substrates 602/604 are attached to opposing sides of the interposer 600. In other embodiments, the first and second substrates 602/604 are attached to the same side of the interposer 600. In further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600.

In accordance with embodiments of the disclosure, apparatuses or processes disclosed herein may be used in the fabrication of interposer 600.

Figure 7:
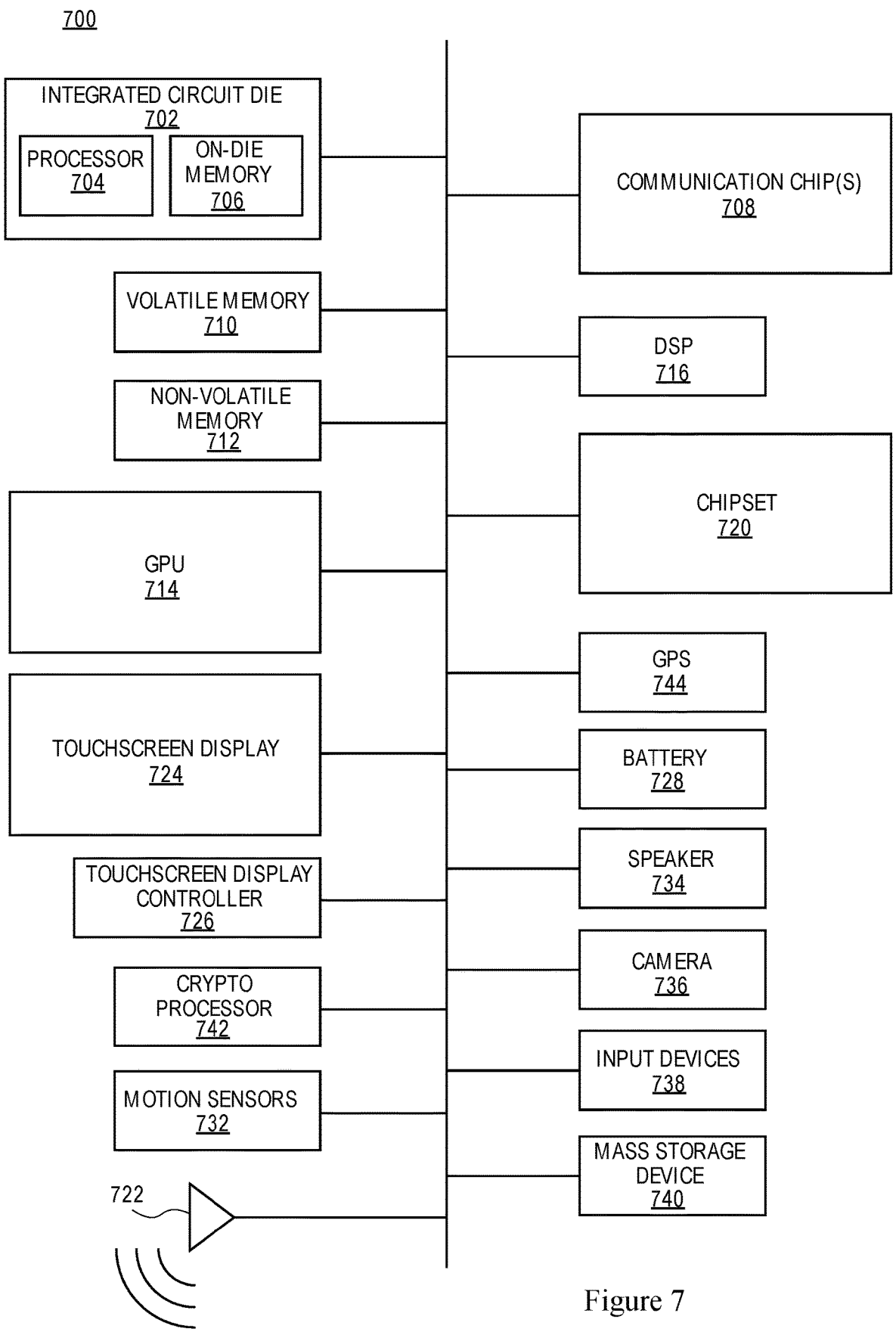
FIG. 7 schematically illustrates a computing device built in accordance with an embodiment of the disclosure, in accordance with some embodiments.

FIG. 7 illustrates a computing device 700 in accordance with one embodiment of the disclosure. The computing device 700 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 700 include, but are not limited to, an integrated circuit die 702 and at least one communications logic unit 708. In some implementations the communications logic unit 708 is fabricated within the integrated circuit die 702 while in other implementations the communications logic unit 708 is fabricated in a separate integrated circuit chip that may be bonded to a substrate or motherboard that is shared with or electronically coupled to the integrated circuit die 702. The integrated circuit die 702 may include a processor 704 as well as on-die memory 706, often used as cache memory, which can be provided by technologies such as embedded DRAM (eDRAM), or SRAM. For example, the on-die memory 706 may include the fuse element 100 shown in FIG. 1, the fuse element 210 shown in FIG. 2, the fuse element 310 shown in FIG. 3, or the fuse memory array 500 shown in FIG. 5.

In embodiments, the computing device 700 may include a display or a touchscreen display 724, and a touchscreen display controller 726. A display or the touchscreen display 724 may include a FPD, an AMOLED display, a TFT LCD, a micro light-emitting diode (μLED) display, or others.

Computing device 700 may include other components that may or may not be physically and electrically coupled to the motherboard or fabricated within a SoC die. These other components include, but are not limited to, volatile memory 710 (e.g., dynamic random access memory (DRAM), non-volatile memory 712 (e.g., ROM or flash memory), a graphics processing unit 714 (GPU), a digital signal processor (DSP) 716, a crypto processor 742 (e.g., a specialized processor that executes cryptographic algorithms within hardware), a chipset 720, at least one antenna 722 (in some implementations two or more antenna may be used), a battery 730 or other power source, a power amplifier (not shown), a voltage regulator (not shown), a global positioning system (GPS) device 728, a compass, a motion coprocessor or sensors 732 (that may include an accelerometer, a gyroscope, and a compass), a microphone (not shown), a speaker 734, a camera 736, user input devices 738 (such as a keyboard, mouse, stylus, and touchpad), and a mass storage device 740 (such as hard disk drive, compact disk (CD), digital versatile disk (DVD), and so forth). The computing device 700 may incorporate further transmission, telecommunication, or radio functionality not already described herein. In some implementations, the computing device 700 includes a radio that is used to communicate over a distance by modulating and radiating electromagnetic waves in air or space. In further implementations, the computing device 700 includes a transmitter and a receiver (or a transceiver) that is used to communicate over a distance by modulating and radiating electromagnetic waves in air or space.

The communications logic unit 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 700 may include a plurality of communications logic units 708. For instance, a first communications logic unit 708 may be dedicated to shorter range wireless communications such as Wi-Fi, NFC, and Bluetooth and a second communications logic unit 708 may be dedicated to longer range wireless communications such as GPS, EDGE, GPRS, CDMA, WiMAX, LTE, Ev-DO, and others.

The processor 704 of the computing device 700 includes one or more devices, such as transistors. The term "processor" may refer to any device or portion of a device that processes electronic data from registers and/or memory to transform that electronic data into other electronic data that may be stored in registers and/or memory. The communications logic unit 708 may also include one or more devices, such as transistors.

In further embodiments, another component housed within the computing device 700 may contain one or more devices, such as a fuse memory array or fuse elements, which are formed in accordance with implementations of the current disclosure, e.g., the fuse element 100 shown in FIG. 1, the fuse element 210 shown in FIG. 2, the fuse element 310 shown in FIG. 3, a fuse element formed according to the process 400 shown in FIG. 4, or the fuse memory array 500 shown in FIG. 5.

In various embodiments, the computing device 700 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some non-limiting Examples are provided below.

Example 1 may include an integrated circuit (IC), comprising: a metal interconnect above a substrate; a first contact above the metal interconnect and in contact with the metal interconnect; and a second contact above the metal interconnect and in contact with the metal interconnect, wherein a first resistance exists between the first contact and the second contact through the metal interconnect, and wherein a second resistance exists between the first contact, the metal interconnect, the second contact, and a non-conducting barrier as an interface between the second contact and the metal interconnect, the non-conducting barrier is formed after a programming voltage is applied to the second contact while the first contact is coupled to a ground terminal to generate a current between the first contact and the second contact.

Example 2 may include the integrated circuit of example 1 and/or some other examples herein, wherein the current is less than or equal to about 10 milliamps (mA).

Example 3 may include the integrated circuit of example 1 and/or some other examples herein, wherein the programming voltage is supplied by a 1.8 voltage supply.

Example 4 may include the integrated circuit of example 1 and/or some other examples herein, wherein the programming voltage is about 1.6 voltage.

Example 5 may include the integrated circuit of example 1 and/or some other examples herein, wherein the first resistance is in a range of about 100 ohms to about 600 ohms.

Example 6 may include the integrated circuit of example 1 and/or some other examples herein, wherein the second resistance is larger than 10,000 ohms.

Example 7 may include the integrated circuit of example 1 and/or some other examples herein, wherein the metal interconnect includes titanium (Ti) or tungsten (W).

Example 8 may include the integrated circuit of example 1 and/or some other examples herein, wherein the first contact or the second contact includes Ti, W, molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

Example 9 may include the integrated circuit of example 1 and/or some other examples herein, further comprising the substrate, wherein the substrate includes a silicon substrate, a glass substrate, a metal substrate, a substrate including and SiO2, or a plastic substrate.

Example 10 may include the integrated circuit of example 1 and/or some other examples herein, further comprising an interlayer dielectric layer between the substrate and the metal interconnect.

Example 11 may include the integrated circuit of example 1 and/or some other examples herein, wherein the first contact or the second contact includes a via of an interconnect of the integrated circuit.

Example 12 may include the integrated circuit of example 1 and/or some other examples herein, further comprising: a transistor with a gate electrode, wherein the gate electrode include a same material as the metal interconnect.

Example 13 may include the integrated circuit of example 12 and/or some other examples herein, wherein the gate electrode and the metal interconnect are in different metal layers of the integrated circuit.

Example 14 may include a method for forming an integrated circuit, the method comprising: forming a metal interconnect above a substrate; forming a first contact above the metal interconnect and in contact with the metal interconnect; and forming a second contact above the metal interconnect and in contact with the metal interconnect, wherein a first resistance exists between the first contact and the second contact through the metal interconnect, and wherein a second resistance exists between the first contact, the metal interconnect, the second contact, and a non-conducting barrier as an interface between the second contact and the metal interconnect, the non-conducting barrier is formed after a programming voltage is applied to the second contact while the first contact is coupled to a ground terminal to generate a current between the first contact and the second contact.

Example 15 may include the method of example 14 and/or some other examples herein, further comprising: forming a source area within the substrate, a drain area within the substrate, and a channel area between the source area and the drain area within the substrate; and forming a gate electrode above the channel area and above the substrate, wherein the gate electrode include a same material as the metal interconnect.

Example 16 may include the method of example 14 and/or some other examples herein, wherein the current is less than or equal to about 10 milliamps (mA).

Example 17 may include the method of example 14 and/or some other examples herein, wherein the programming voltage is supplied by a 1.8 voltage supply.

Example 18 may include the method of example 14 and/or some other examples herein, wherein the first resistance is in a range of about 100 ohms to about 600 ohms.

Example 19 may include the method of example 14 and/or some other examples herein, wherein the second resistance is larger than 10,000 ohms.

Example 20 may include the method of example 14 and/or some other examples herein, wherein the metal interconnect includes titanium (Ti) or tungsten (W).

Example 21 may include a computing device, comprising: a circuit board; and a fuse memory array coupled to the circuit board, wherein the fuse memory array includes a plurality of fuse cells, a fuse cell of the plurality of fuse cells includes a fuse element coupled to a selector, and wherein the fuse element includes: a metal interconnect above a substrate; a first contact above the metal interconnect and in contact with the metal interconnect, wherein the first contact is coupled to a bit line of the fuse memory array; and a second contact above the metal interconnect and in contact with the metal interconnect, wherein the second contact is coupled to a first contact of the selector, and the selector includes a second contact coupled to a word line of the fuse memory array, a first resistance exists between the first contact and the second contact through the metal interconnect, and wherein a second resistance exists between the first contact, the metal interconnect, the second contact, and a non-conducting barrier as an interface between the second contact and the metal interconnect, the non-conducting barrier is formed after a programming voltage is applied to the second contact and the first contact is coupled to a ground terminal to generate a current between the first contact and the second contact.

Example 22 may include the computing device of example 21 and/or some other examples herein, wherein the programming voltage is about 1.6 voltage.

Example 23 may include the computing device of example 21 and/or some other examples herein, wherein the first resistance is in a range of about 100 ohms to about 600 ohms, and the second resistance is larger than 10,000 ohms.

Example 24 may include the computing device of example 21 and/or some other examples herein, wherein the fuse element is without a void space when the non-conducting barrier is formed after the programming voltage is applied to the second contact and the first contact is coupled to the ground terminal to generate the current between the first contact and the second contact.

Example 25 may include the computing device of example 21 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
   a metal interconnect above a substrate;
   a first contact above the metal interconnect and in contact with the metal interconnect; and
   a second contact above the metal interconnect and in contact with the metal interconnect, wherein a first resistance exists between the first contact and the second contact through the metal interconnect, and wherein a second resistance exists between the first contact, the metal interconnect, the second contact, and a non-conducting barrier as an interface between the second contact and the metal interconnect, the non-conducting barrier is formed after a programming voltage is applied to the second contact while the first contact is coupled to a ground terminal to generate a current between the first contact and the second contact.

2. The integrated circuit of claim 1, wherein the current is less than or equal to about 10 milliamps (mA).

3. The integrated circuit of claim 1, wherein the programming voltage is supplied by a 1.8 voltage supply.

4. The integrated circuit of claim 1, wherein the programming voltage is about 1.6 voltage.

5. The integrated circuit of claim 1, wherein the first resistance is in a range of about 100 ohms to about 600 ohms.

6. The integrated circuit of claim 1, wherein the second resistance is larger than 10,000 ohms.

7. The integrated circuit of claim 1, wherein the metal interconnect includes titanium (Ti) or tungsten (W).

8. The integrated circuit of claim 1, wherein the first contact or the second contact includes Ti, W, molybdenum (Mo), gold (Au), platinum (Pt), aluminum (Al), nickel (Ni), copper (Cu), chromium (Cr), hafnium (Hf), indium (In), or an alloy of Ti, W, Mo, Au, Pt, Al, Ni, Cu, Cr, TiAlN, HfAlN, or InAlO.

9. The integrated circuit of claim 1, further comprising the substrate, wherein the substrate includes a silicon substrate, a glass substrate, a metal substrate, a substrate including and $SiO_2$, or a plastic substrate.

10. The integrated circuit of claim 1, further comprising an interlayer dielectric layer between the substrate and the metal interconnect.

11. The integrated circuit of claim 1, wherein the first contact or the second contact includes a via of an interconnect of the integrated circuit.

12. The integrated circuit of claim 1, further comprising:
    a transistor with a gate electrode, wherein the gate electrode include a same material as the metal interconnect.

13. The integrated circuit of claim 12, wherein the gate electrode and the metal interconnect are in different metal layers of the integrated circuit.

14. A method for forming an integrated circuit, the method comprising:
    forming a metal interconnect above a substrate;
    forming a first contact above the metal interconnect and in contact with the metal interconnect; and
    forming a second contact above the metal interconnect and in contact with the metal interconnect, wherein a first resistance exists between the first contact and the second contact through the metal interconnect, and wherein a second resistance exists between the first contact, the metal interconnect, the second contact, and a non-conducting barrier as an interface between the second contact and the metal interconnect, the non-conducting barrier is formed after a programming voltage is applied to the second contact while the first contact is coupled to a ground terminal to generate a current between the first contact and the second contact.

15. The method of claim 14, further comprising:
forming a source area within the substrate, a drain area within the substrate, and a channel area between the source area and the drain area within the substrate; and
forming a gate electrode above the channel area and above the substrate, wherein the gate electrode include a same material as the metal interconnect.

16. The method of claim 14, wherein the current is less than or equal to about 10 milliamps (mA).

17. The method of claim 14, wherein the programming voltage is supplied by a 1.8 voltage supply.

18. The method of claim 14, wherein the first resistance is in a range of about 100 ohms to about 600 ohms.

19. The method of claim 14, wherein the second resistance is larger than 10,000 ohms.

20. The method of claim 14, wherein the metal interconnect includes titanium (Ti) or tungsten (W).

21. A computing device, comprising:
a circuit board; and
a fuse memory array coupled to the circuit board, wherein the fuse memory array includes a plurality of fuse cells, a fuse cell of the plurality of fuse cells includes a fuse element coupled to a selector, and wherein the fuse element includes:
a metal interconnect above a substrate;
a first contact above the metal interconnect and in contact with the metal interconnect, wherein the first contact is coupled to a bit line of the fuse memory array; and
a second contact above the metal interconnect and in contact with the metal interconnect, wherein the second contact is coupled to a first contact of the selector, and the selector includes a second contact coupled to a word line of the fuse memory array, a first resistance exists between the first contact and the second contact through the metal interconnect, and wherein a second resistance exists between the first contact, the metal interconnect, the second contact, and a non-conducting barrier as an interface between the second contact and the metal interconnect, the non-conducting barrier is formed after a programming voltage is applied to the second contact and the first contact is coupled to a ground terminal to generate a current between the first contact and the second contact.

22. The computing device of claim 21, wherein the programming voltage is about 1.6 voltage.

23. The computing device of claim 21, wherein the first resistance is in a range of about 100 ohms to about 600 ohms, and the second resistance is larger than 10,000 ohms.

24. The computing device of claim 21, wherein the fuse element is without a void space when the non-conducting barrier is formed after the programming voltage is applied to the second contact and the first contact is coupled to the ground terminal to generate the current between the first contact and the second contact.

25. The computing device of claim 21, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device.

* * * * *